(12) United States Patent
Mayhew

(10) Patent No.: US 8,365,048 B2
(45) Date of Patent: Jan. 29, 2013

(54) VEHICLE COMMUNICATION SYSTEM DIAGNOSTIC USING HAMMING CODE

(75) Inventor: William R. Mayhew, Ann Arbor, MI (US)

(73) Assignee: GM Global Technology Operations LLC

( * ) Notice: Subject to any disclaimer, the term of this patent is extended or adjusted under 35 U.S.C. 154(b) by 83 days.

(21) Appl. No.: 11/860,944

(22) Filed: Sep. 25, 2007

(65) Prior Publication Data

US 2011/0289390 A1 Nov. 24, 2011

Related U.S. Application Data

(60) Provisional application No. 60/847,226, filed on Sep. 26, 2006.

(51) Int. Cl.
*G06F 11/00* (2006.01)
(52) U.S. Cl. ..................................................... 714/777
(58) Field of Classification Search .................. 714/777
See application file for complete search history.

(56) References Cited

U.S. PATENT DOCUMENTS

| | | | | |
|---|---|---|---|---|
| 3,648,239 A * | 3/1972 | Carter et al. | ................... | 714/758 |
| 5,347,456 A * | 9/1994 | Zhang et al. | ..................... | 701/23 |
| 5,875,439 A * | 2/1999 | Engel et al. | ...................... | 706/41 |
| 6,469,642 B1 * | 10/2002 | Kreppold | .......................... | 341/20 |
| 6,604,222 B1 * | 8/2003 | Jensen | ........................... | 714/785 |
| 8,069,395 B2 * | 11/2011 | Deierling et al. | .............. | 714/759 |
| 2006/0087950 A1 * | 4/2006 | Linnartz | ........................ | 369/100 |
| 2009/0204877 A1 * | 8/2009 | Betts | ............................... | 714/806 |
| 2009/0259852 A1 * | 10/2009 | Linnartz | ........................ | 713/176 |

OTHER PUBLICATIONS

Dipperstein, Michael "Hamming (7,4) Code Discussion and Implentation" Last updated Oct. 4, 2010.*

* cited by examiner

*Primary Examiner* — Bryce Bonzo

(57) ABSTRACT

A control system includes an error calculation module that receives a data bit pattern having a predetermined quantity of data bits and that calculates a binary vector based on a predetermined binary matrix and the data bit pattern. The error calculation module further determines the data bit pattern contains a corrupted data bit when the binary vector is not a predetermined value. The control system further includes a bit position module that receives the binary vector, that locates the corrupted data bit based on the binary vector and that corrects the data bit pattern. The bit position module receives the data bit pattern when the binary number is the predetermined value. The data bits are pre-assigned a base-10 value that corresponds to a data bit position.

20 Claims, 3 Drawing Sheets

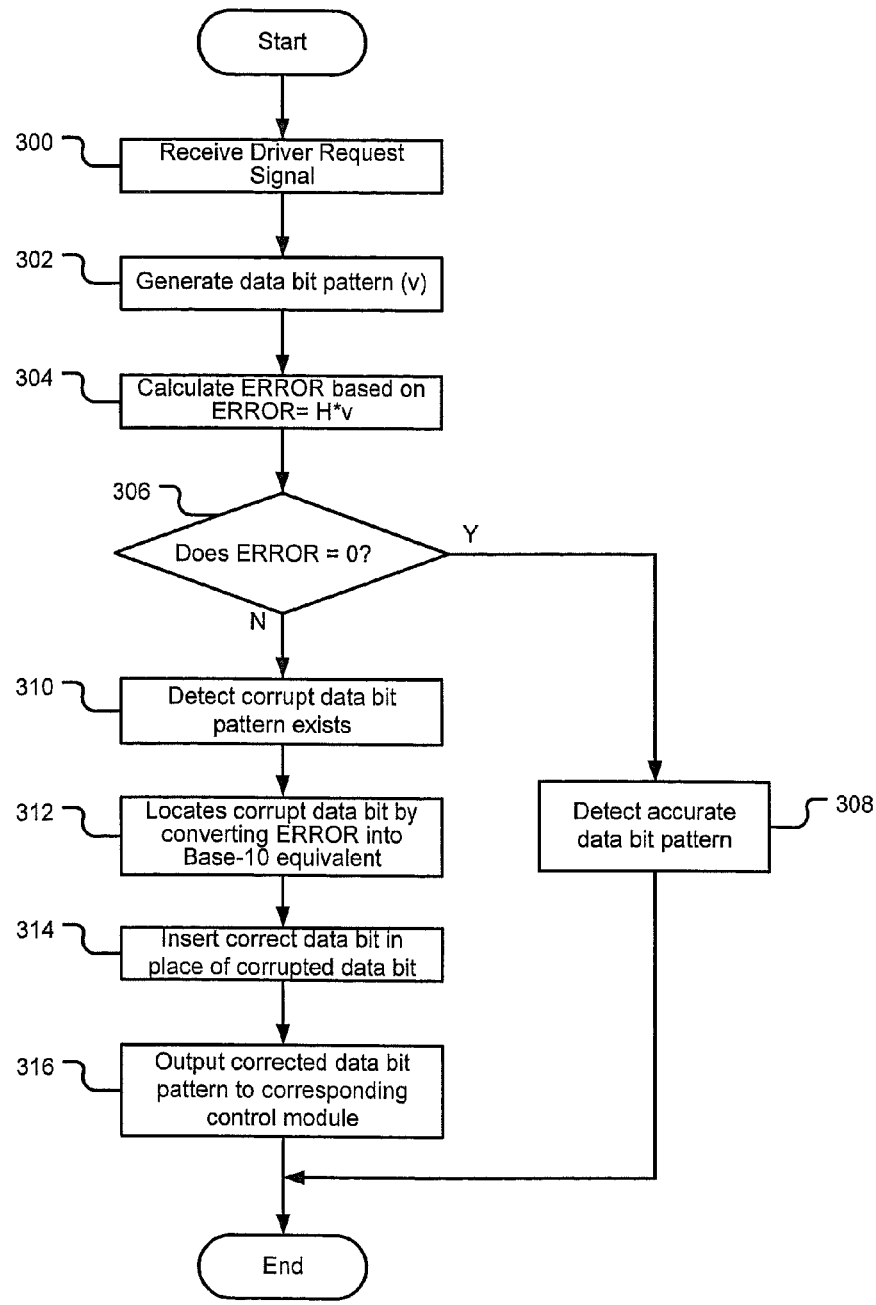

VEHICLE COMMUNICATION SYSTEM DIAGNOSTIC USING HAMMING CODE

CROSS-REFERENCE TO RELATED APPLICATIONS

This application claims the benefit of U.S. Provisional Application No. 60/847,226, filed on Sep. 26, 2006. The disclosure of the above application is incorporated herein by reference.

FIELD OF THE INVENTION

The present invention relates to vehicle systems, and more particularly to a control system for reducing data errors in a vehicle communication system.

BACKGROUND OF THE INVENTION

Vehicles utilize one or more control modules and/or sensors that regulate one or more electrical subsystems, such as a transmission system and an engine system. The control modules and/or sensors transmit data to each other. The data controls various electrical operations of the subsystem. When sending one or more data words, each including multiple bits, one or more data bits can be corrupted. As a result, a control module can receive one or more corrupt data words that may cause the subsystem to operate incorrectly.

SUMMARY OF THE INVENTION

Accordingly, a control system includes an error calculation module that receives a data bit pattern having a predetermined quantity of data bits and that calculates a binary vector based on a predetermined binary matrix and the data bit pattern. The error calculation module further determines the data bit pattern contains a corrupted data bit when the binary vector is not a predetermined value. The control system further includes a bit position module that receives the binary vector, that locates the corrupted data bit based on the binary vector and that corrects the data bit pattern. The bit position module receives the data bit pattern when the binary number is the predetermined value. The data bits are pre-assigned a base-10 value that corresponds to a data bit position.

In one feature, the bit position module converts the binary vector into an equivalent base-10 value that indicates a corrupt data bit position.

In another feature, the corrupt data bit position contains the corrupted data bit.

In another feature, the bit calculation module corrects the data bit pattern by replacing the corrupted data bit with a correct data bit.

In yet another feature the bit position module outputs a corrected data bit pattern after replacing the corrupted data bit.

In still another feature the predetermined value is 0.

BRIEF DESCRIPTION OF THE DRAWINGS

The present invention will become more fully understood from the detailed description and the accompanying drawings, wherein:

FIG. 3 is a flow chart illustrating steps executed by a control system for detecting data bit errors according to the present invention.

DETAILED DESCRIPTION OF THE PREFERRED EMBODIMENTS

Figure 1:
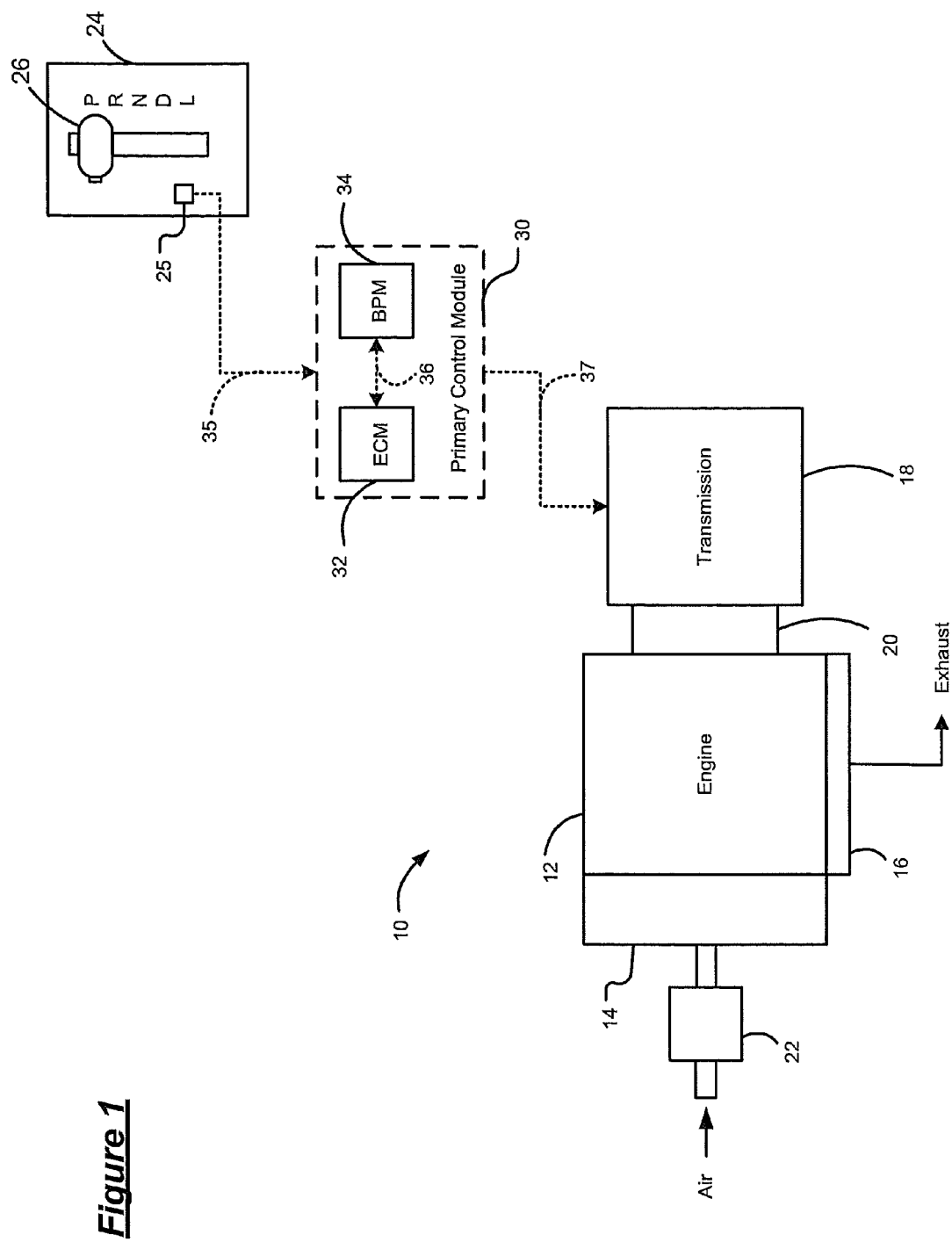
FIG. 1 is a schematic illustration of an exemplary vehicle including a control system for detecting data bit errors according to the principles of the present invention.

The following description of the preferred embodiment is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Referring now to FIG. 1, an exemplary engine system 10 is illustrated. The engine system 10 includes an engine 12, an intake manifold 14, an exhaust manifold 16, a transmission 18 and a coupling device 20. The engine includes spark-ignited engines and diesel engines. The transmission 18 includes an automatic transmission and the coupling device 20 includes a torque converter.

The engine 12 combusts an air and fuel mixture within cylinders (not shown) to drive pistons (not shown) that drive the transmission through the coupling device. Air is drawn through a throttle 22 and into the intake manifold 14, which distributes air to the cylinders. Exhaust from the combustion process is exhausted from the cylinders and into the exhaust manifold 16. The exhaust is treated in an exhaust system (not shown) and is released to atmosphere.

A driver input device (DID) 24 is also included and enables the driver to indicate a desired transmission operating mode. More specifically, the DID 24 is illustrated as a PRNDL lever 26 that enables a driver to shift the operating range of the transmission between park (P), reverse (R), neutral (N), drive (D) and low drive (L). The DID 24 can also include tap-shift inputs (i.e., tap-shift up and tap-shift down) that enable a driver to command gear shifts. A position sensor 25 is disposed within the DID 24 and is responsive to the position of the PRNDL lever 26.

The engine system 10 further includes a control system 28 having a primary control module 30, an error calculation module 32 and a bit position module 34. Although the error calculation module 32 and the bit position module 34 are shown as separate control modules located within the primary control module 30, the error calculation module 32 and the bit position module 34 can be located externally. Alternatively, the error calculation module 32 and the bit position module 34 can be implemented together as a single module.

The error calculation module 32 communicates with the bit position module 34 and the primary control module 30 and determines whether a data bit pattern (v) contains a corrupt data bit. The bit position module 34 communicates with the primary control module 30 and locates the corrupt data bit, as discussed in greater detail below. Additionally, the bit position module 34 replaces the corrupt data bit with the correct data bit and outputs an accurate data bit pattern (v).

The primary control module 30 controls operation of a corresponding vehicle subsystem, such as the transmission 18, based on the data bit pattern (v) 35. More specifically, the primary control module 30 receives a 7-bit data pattern 35. The data bit pattern (v) 35 includes 4-bits of data output by the DID sensor 25 and 3 bits of data output by pressure switches (not shown). The data output by the DID sensor 25 indicates the position of the DID 24. The position of the DID 24 indicates a desired operating state, such as the D transmission state. The data output by the pressure switches indicates the pressure of fluid in an associated fluid line (not shown) in the transmission 18.

The primary control module 30 initiates operation of electric motors, solenoids and/or other actuating components to operate the transmission 18 into the desired range as indicated by the 7-bit pattern. For example, if the PRNDL lever 26 is in the P position. Accordingly, the primary control module 30 may receive a second data pattern. Accordingly, the primary control module 30 can actuate a solenoid to lock a parking pawl of the transmission 18 to inhibit vehicle movement. Alternatively, if the PRNDL lever 26 is in the D position, the primary control module 30 can actuate a solenoid to regulate hydraulic fluid flow to shift gears of the transmission 18 based on a shift schedule. Although a 7-bit data pattern is used, one skilled in the art can appreciate that an electrical subsystem may utilize a data bit pattern that has less or more data bits.

Figure 2:
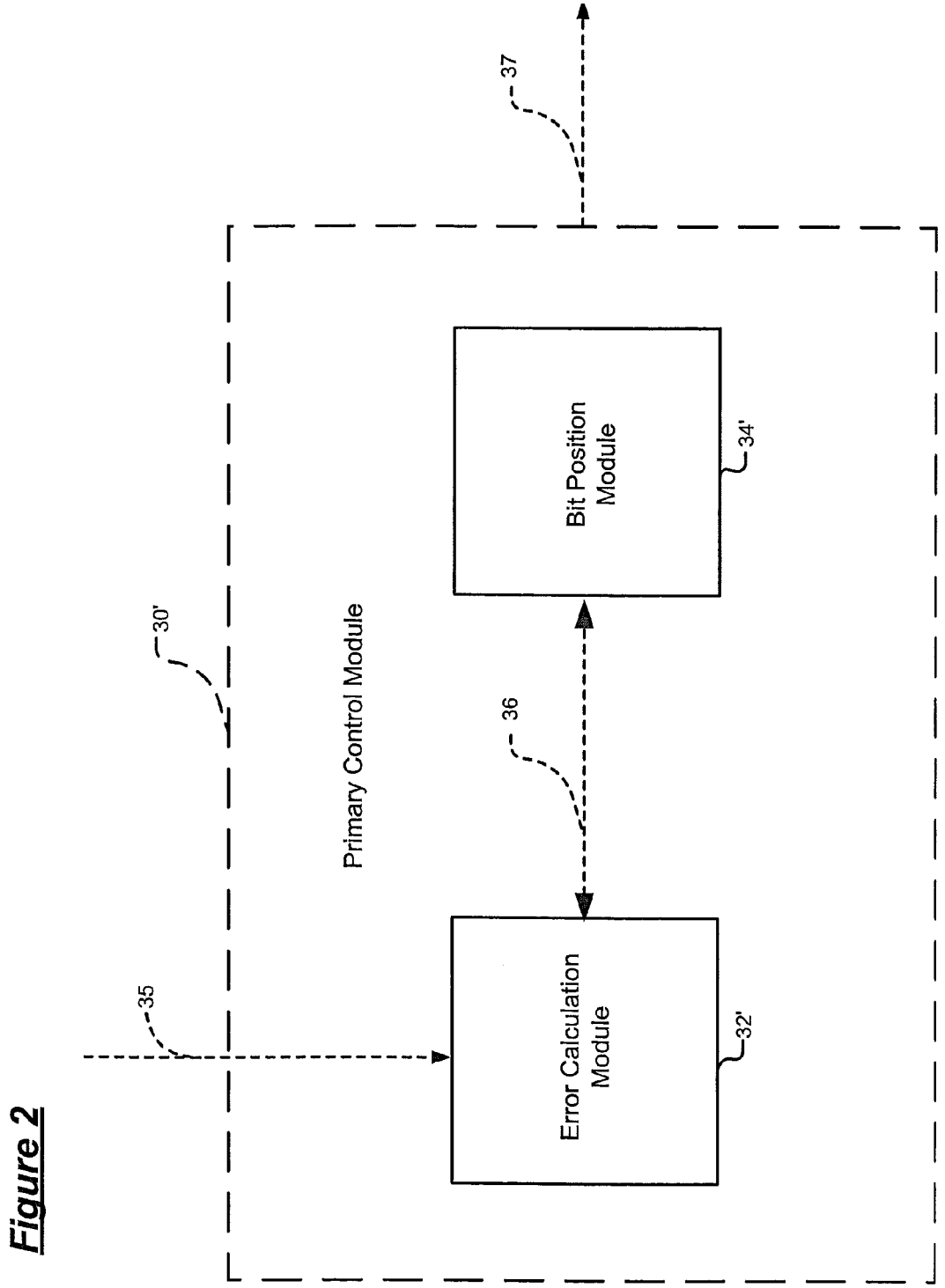
FIG. 2 is a functional block diagram of a control system for detecting data bit errors according to the principle of the present invention.

Referring now to FIG. 2, a detailed illustration of the control system 28 described above is shown. The control system 28' of FIG. 2 contains like components to those illustrated in FIG. 1. Therefore, like reference numerals will be used to indicate like components.

The control system 28' includes the error calculation module 32', the bit position module 34' and the primary control module 30'. As stated above, the primary control module controls operation of the transmission based on the 7-bit data pattern (v) 35. However, one or more data bits can be corrupted and may cause the transmission to operate incorrectly.

To reduce the possibility that the transmission operates based on a corrupt data pattern, the control system 28' can utilize a Hamming code diagnostic. The Hamming code utilizes a binary counting matrix (H) and a set of binary kernel vectors (k) such that the product of H and each k is 0. When a single bit in k is corrupt such that the resulting vector is not one of the kernel vectors, the product of the Hamming code indicates a single corrupt data bit exists. Additionally, the product indicates the position of the corrupt bit. When applying a Hamming code diagnostic to a 7-bit data bit pattern, a 3×7 matrix is used. Although the control system 28' uses 3×7 matrix, the size of the matrix can change based on the data that is diagnosed.

The error calculation module 32' determines whether a data bit pattern (v) 35 from the DID 24 contains corrupt information. The data bit pattern (v) is typically a 7-bit binary pattern. The data bit pattern (v) 35 includes 7 bit positions numbered 1 through 7 from right to left. Each bit position contains a single binary value. The binary value can be 0 or 1.

Specifically, the error calculation module 32' calculates a result vector (ERROR) 36 that indicates whether a single corrupt data bit exists according to the following equation:

$$H \cdot v = \text{ERROR} \quad (1)$$

where $$H = \begin{bmatrix} 1 & 1 & 1 & 1 & 0 & 0 & 0 \\ 1 & 1 & 0 & 0 & 1 & 1 & 0 \\ 1 & 0 & 1 & 0 & 1 & 0 & 1 \end{bmatrix};$$

and
v is an input vector representing the communicated data bit pattern.

Substituting H into equation (1), ERROR can be defined as:

$$\begin{bmatrix} 1 & 1 & 1 & 1 & 0 & 0 & 0 \\ 1 & 1 & 0 & 0 & 1 & 1 & 0 \\ 1 & 0 & 1 & 0 & 1 & 0 & 1 \end{bmatrix} \cdot v = \begin{bmatrix} x \\ y \\ z \end{bmatrix}$$

where the value x represents $\lfloor x \cdot 2^2 \rfloor$, the value y represents $\lfloor y \cdot 2^1 \rfloor$ and the value z represents $\lfloor z \cdot 2^0 \rfloor$.

Accordingly, ERROR 36 represents a 3 bit binary number. When ERROR is 0, the error calculation module 32' determines that the data bit pattern (v) is accurate. Otherwise, the error calculation module 32' determines a single corrupt data bit exists in the data bit pattern (v).

The error control module 32' outputs the accurate data bit pattern directly to the primary control module 30'. However, when the data bit pattern is corrupt, ERROR is output to the bit position module 34'. The bit position module 34' determines the location of the corrupt data bit based on ERROR. As stated above, ERROR represents a 3-bit binary number. The base-10 equivalent of ERROR indicates the location of the corrupt data bit. Specifically, the bit position module 34' determines which single data bit is corrupt by converting ERROR into the base 10-equivalent. For example, $$\text{ERROR} = \begin{bmatrix} 1 \\ 0 \\ 1 \end{bmatrix}$$

is a binary representation of the base-10 number 5. Therefore, ERROR indicates that the corrupt data bit is located in the 5$^{th}$ position of the data bit pattern (v).

Accordingly, the bit position module 34' can generate a corrected data bit pattern 37 by replacing the corrupt data bit with the correct data bit. For example, if a corrupt data bit is detected in position 5 of the data bit pattern, v=[1010101], the bit position module 34' will replace the 1 with a 0. The resulting data bit pattern will be [1000101]. After replacing the corrupt data bit, the proper data bit pattern is output to the primary control module 30'.

Referring now to FIG. 3, a flowchart illustrates steps executed by a control system 28 for detecting and correcting errors in data bit patterns (v) according to the present teachings. In step 300, control receives a request signal from a DID 24. In step 302, control generates a data bit pattern (v) corresponding to the position of the DID 24. Control calculates whether a single corrupt data bit exists based on a predetermined binary matrix (H) and the data bit pattern (v) in step 304. In step 306, control determines whether the calculated result (ERROR) is 0. When the calculated result is 0, control determines that the data bit pattern (v) is accurate in step 308 and ends. Otherwise, control detects a single corrupt data bit exists in step 310.

In step 312, control locates the corrupt data bit based on the binary matrix (H) and the data bit pattern (v). Specifically, control locates the corrupt data bit by converting ERROR into a Base-10 equivalent value. In step 314, control corrects the data bit pattern (v) by replacing the corrupt data bit with the correct data bit. In step 316, control outputs the corrected data bit pattern to the corresponding primary control module 30 and control ends.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A control system, comprising:
   an error calculation module that:
      receives a data bit pattern from a first vehicle sensor and a second vehicle sensor, wherein said data bit pattern indicates operating conditions of a transmission and has a predetermined quantity of data bits, wherein said first vehicle sensor outputs data indicating a gear selector position and said second vehicle sensor outputs data indicating an operating condition of said transmission that is not usable to determine said gear selector position;
      calculates a binary vector based on a predetermined binary matrix and said data bit pattern; and
      determines said data bit pattern contains a corrupted data bit when said binary vector is not a predetermined value; and
   a bit position module that receives said binary vector, that locates said corrupted data bit based on said binary vector and that corrects said data bit pattern,
   wherein said bit position module receives said data bit pattern when said binary vector is not said predetermined value, and
   wherein said data bits are pre-assigned a base-10 value that corresponds to a data bit position.

2. The control system of claim 1 wherein said bit position module converts said binary vector into an equivalent base-10 value that indicates a corrupt data bit position.

3. The control system of claim 2 wherein said corrupt data bit position contains said corrupted data bit.

4. The control system of claim 2 wherein said bit position module outputs a corrected data bit pattern after replacing said corrupted data bit.

5. The control system of claim 1 wherein said bit position module corrects said data bit pattern by replacing said corrupted data bit with a correct data bit.

6. The control system of claim 1 wherein said predetermined value is 0.

7. The control system of claim 1, further comprising a primary control module that controls a vehicle subsystem based on said data bit pattern.

8. The control system of claim 1, wherein said first vehicle sensor outputs M bits that indicate said gear selector position and said second vehicle sensor outputs N bits that indicate said operating condition, wherein M and N are integers greater than one.

9. The control system of claim 1, wherein said operating condition is associated with a hydraulic system of said transmission.

10. The control system of claim 9, wherein said operating condition is fluid pressure in a fluid line associated with said transmission.

11. A method of detecting data errors, comprising:
   receiving a data bit pattern from a first vehicle sensor and a second vehicle sensor, wherein said data bit pattern indicates operating conditions of a transmission and has a predetermined quantity of data bits, wherein said first vehicle sensor outputs data indicating a gear selector position and said second vehicle sensor outputs data indicating an operating condition of said transmission that is not usable to determine said gear selector position;
   calculating a binary vector based on a predetermined binary matrix and said data bit pattern;
   determining said data bit pattern contains a corrupted data bit when said binary vector is not a predetermined value;
   locating said corrupted data bit based on said binary vector; and
   correcting said data bit pattern,
   wherein said data bits are pre-assigned a base-10 value that corresponds to a data bit position.

12. The method of claim 11 further comprising said binary vector into an equivalent base-10 value that indicates a corrupt data bit position.

13. The method of claim 12 wherein said corrupt data bit position contains said corrupted data bit.

14. The method of claim 12 further comprising outputting a corrected data bit pattern after replacing said corrupted data bit.

15. The method of claim 11 further comprising said data bit pattern by replacing said corrupted data bit with a correct data bit.

16. The method of claim 11 wherein said predetermined value is 0.

17. The method of claim 11, further comprising controlling a vehicle system based on said data bit pattern.

18. The method of claim 11, wherein said first vehicle sensor outputs M bits that indicate said pear selector position and said second vehicle sensor outputs N bits that indicate said operating condition, wherein M and N are integers greater than one.

19. The method of claim 11, wherein said operating condition is associated with a hydraulic system of said transmission.

20. The method of claim 19, wherein said operating condition is fluid pressure in a fluid line associated with said transmission.

* * * * *